(12) United States Patent
Sato et al.

(10) Patent No.: US 9,263,644 B2
(45) Date of Patent: Feb. 16, 2016

(54) SEMICONDUCTOR LIGHT-EMITTING DEVICE AND METHOD OF FORMING ELECTRODE

(71) Applicant: Sharp Kabushiki Kaisha, Osaka-shi (JP)

(72) Inventors: Tomohisa Sato, Osaka (JP); Jun Mori, Osaka (JP)

(73) Assignee: SHARP KABUSHIKI KAISHA, Osaka-Shi (JP)

( * ) Notice: Subject to any disclaimer, the term of this patent is extended or adjusted under 35 U.S.C. 154(b) by 0 days.

(21) Appl. No.: 14/744,498

(22) Filed: Jun. 19, 2015

(65) Prior Publication Data

US 2015/0287887 A1    Oct. 8, 2015

Related U.S. Application Data

(62) Division of application No. 13/739,944, filed on Jan. 11, 2013, now Pat. No. 9,065,018.

(30) Foreign Application Priority Data

Jan. 13, 2012 (JP) .................. 2012-004669
Sep. 14, 2012 (JP) .................. 2012-202199

(51) Int. Cl.
  *H01L 21/44* (2006.01)
  *H01L 33/40* (2010.01)
(52) U.S. Cl.
  CPC ....... *H01L 33/405* (2013.01); *H01L 2933/0016* (2013.01)
(58) Field of Classification Search
  None
  See application file for complete search history.

(56) References Cited

U.S. PATENT DOCUMENTS

| 2004/0256632 A1 | 12/2004 | Stein et al. |
| 2006/0081869 A1 | 4/2006 | Lu et al. |
| 2006/0214574 A1 | 9/2006 | Kawaguchi et al. |
| 2007/0117235 A1 | 5/2007 | Stein et al. |
| 2010/0258837 A1 | 10/2010 | Hori et al. |
| 2011/0037092 A1 | 2/2011 | Hori et al. |
| 2011/0089401 A1 | 4/2011 | Hiraiwa et al. |

FOREIGN PATENT DOCUMENTS

| JP | 10-270753 | 10/1998 |
| JP | 2002-26392 | 1/2002 |

(Continued)

OTHER PUBLICATIONS

Sato et al., U.S. Office Action mailed Jul. 9, 2014, directed to U.S. Appl. No. 13/739,944; 14 pages.

(Continued)

*Primary Examiner* — Sonya D McCall Shepard
(74) *Attorney, Agent, or Firm* — Morrison & Foerster LLP

(57) ABSTRACT

A semiconductor light-emitting device having an electrode that can be manufactured by a simple method and is unlikely to deteriorate, and a method for forming the electrode are provided. The semiconductor light-emitting device according to the present invention has a semiconductor layered structure having a light-emitting layer that emits light by supplying electric power and an electrode formed on the semiconductor layered structure. The electrode has a reflection layer that reflects light exiting from the light-emitting layer, a barrier layer formed on the upper side and side surface of the reflection layer, and a pad layer formed only on the top surface of the barrier layer.

4 Claims, 15 Drawing Sheets

(56) References Cited

FOREIGN PATENT DOCUMENTS

| | | |
|---|---|---|
| JP | 2002-33511 | 1/2002 |
| JP | 2004-260178 | 9/2004 |
| JP | 2006-80469 | 3/2006 |
| JP | 2006-93358 | 4/2006 |
| JP | 2006-269912 | 10/2006 |
| JP | 2008-41866 | 2/2008 |
| JP | 2008-140841 | 6/2008 |
| JP | 2011-66461 | 3/2011 |
| JP | 2011-204804 | 10/2011 |
| KR | 10-2006-0109375 | 10/2006 |
| KR | 10-2011-0139909 | 12/2011 |
| TW | 201017930 | 5/2010 |

OTHER PUBLICATIONS

Sato et al., U.S. Office Action mailed Nov. 17, 2014, directed to U.S. Appl. No. 13/739,944; 15 pages.

Side Surface Coverage = $T_L/T_V$

SEMICONDUCTOR LIGHT-EMITTING DEVICE AND METHOD OF FORMING ELECTRODE

CROSS REFERENCE TO RELATED APPLICATION

This application is a divisional of U.S. application Ser. No. 13/739,944, filed Jan. 11, 2013, which is a Nonprovisional application that claims priority under 35 U.S.C. §119(a) on Patent Applications No. 2012-004669 filed in Japan on Jan. 13, 2012 and No. 2012-202199 filed in Japan on Sep. 14, 2012 the entire contents of which are hereby incorporated by reference.

BACKGROUND OF THE INVENTION

1. Field of the Invention

The present invention relates to a semiconductor light-emitting device represented by light-emitting diode (LED) and the like, and a method for forming an electrode provided in the semiconductor light-emitting device.

2. Description of the Related Art

The semiconductor light-emitting device represented by LED and the like has advantages such as low power consumption, compact in size, high brightness, and long life, and thus is recently used for various applications. For example, the semiconductor light-emitting device has been used for a lighting system, as a substitute for incandescent lamp that consumes a large amount of electric power.

In addition, a semiconductor light-emitting device having a reflection layer capable of reflecting light exiting from a light-emitting layer in an electrode, in order to further increasing light extraction efficiency, is suggested. For example, in Japanese Unexamined Patent Publication No. 2002-26392, Japanese Unexamined Patent Publication No. 2008-41866, Japanese Unexamined Patent Publication No. 2011-66461, Japanese Unexamined Patent Publication No. 2006-80469, Japanese Unexamined Patent Publication No. 2006-93358, and Japanese Unexamined Patent Publication No. 2011-204804 (hereinafter, referred to as "publicly known documents 1 to 6"), a semiconductor light-emitting device using Al that has high reflectance and is inexpensive as a reflection layer is suggested.

However, Al has a low melting point and is a chemically active material, therefore, there are problems that the surface is susceptible to corrosion, and void and hillock, and migration are likely to occur in the interior. Also, Al is a material that is likely to interdiffuse when contacting with a dissimilar metal, and for example, when contacting with Au, an intermetallic compound of AuAl that is highly resistive and fragile is formed by interdiffusion, and it becomes a factor to damage the reliability of the semiconductor light-emitting device, such that the forward voltage of the semiconductor light-emitting device increases, the adhesion strength of the electrode deteriorates, or the like.

Au is often used as a wire connecting an external power supply and a semiconductor light-emitting device, and in order to favorably connect to this wire, Au is often used as a pad layer of the electrode. However, when both Al layer and Au layer are contained in the electrode, the problem of contact described above arises.

Therefore, for example, publicly known documents 1 to 6 suggest a semiconductor light-emitting device having an electrode in which direct contact between an Al layer and an Au layer is avoided by inserting between the Al layer and the Au layer a layer made of a material other than Al and Au.

Publicly known documents 1 to 5 suggest a semiconductor light-emitting device having an electrode with a structure in which a layer made of a material such as Ti, Pt, W, Ta, and Pd is inserted between the Al layer and the Au layer. However, in the electrodes of the semiconductor light-emitting devices described above, the side surface of the Al layer is exposed, thus the side surface of the Al layer may corrode. In addition, an Au layer may be unintentionally formed on the side surface of the Al layer, and an AuAl intermetallic that is highly resistive and fragile may be formed by an interdiffusion of Al and Au.

On the other hand, publicly known document 6 suggests a semiconductor light-emitting device having an electrode with a structure in which the top surface and side surface of an Al layer are covered with a W layer and the top surface and side surface of the W layer are further covered with an Au. However, in the electrodes of the semiconductor light-emitting devices, an Au layer is present not only in the upper side of the Al layer but also in the side of the Al layer, therefore, the portion where the Al layer and the Au layer are adjacent to each other is increased, and the possibility to generate interdiffusion of Al and Au is increased. In addition, in order to prepare an electrode of this semiconductor light-emitting device, multiple times of photolithography step and multiple times of film formation step are required, and the cost is increased as the manufacturing process is more complicated, thus it is not practical.

SUMMARY OF THE INVENTION

In view of the above-described problems, an object of the present invention is to provide a semiconductor light-emitting device having an electrode that can be manufactured by a simple method and is unlikely to deteriorate, and a method for forming the electrode.

In order to accomplish the above-described object, the present invention provides a semiconductor light-emitting device comprising:

a semiconductor layered structure having a light-emitting layer that emits light by supplying electric power and an electrode formed on the semiconductor layered structure, wherein the electrode comprises:

a reflection layer that reflects light exiting from the light-emitting layer, a barrier layer formed on the upper side and side surface of the reflection layer, and a pad layer formed only on the top surface of the barrier layer.

According to this semiconductor light-emitting device, the structure is formed such that the side surface of a reflection layer is covered by a barrier layer, and also a pad layer is not formed on the side of the reflection layer. Therefore, it is possible to suppress the corrosion of the reflection layer and also suppress the interdiffusion of the material forming the reflection layer and the material forming the pad layer.

Furthermore, in the semiconductor light-emitting device of the above-described features, it is preferred that the reflection layer be made of Al and the pad layer be made of Au.

According to this semiconductor light-emitting device, it is possible to suppress the corrosion of the reflection layer made of Al and also suppress the formation of an AuAl intermetallic formed by the interdiffusion of the Al forming the reflection layer and the Au forming the pad layer.

Furthermore, in the semiconductor light-emitting device of the above-described features, it is preferred that the reflection layer have a film thickness of 40 nm or more and 70 nm or less.

According to this semiconductor light-emitting device, it is possible to secure enough reflectance and also suppress the generation of a void in the reflection layer made of Al or suppress the formation of an AuAl intermetallic formed by the interdiffusion of the Al forming the reflection layer and the Au forming the pad layer.

Furthermore, in the semiconductor light-emitting device of the above-described features, it is preferred that the barrier layer be made of a high melting point metal having a higher melting point than those of Al and Au.

Specifically, it is preferred that the barrier layer contain at least one of Pt, Mo and W.

According to this semiconductor light-emitting device, it is possible to suitably suppress the deterioration of the electrode.

Furthermore, in the semiconductor light-emitting device of the above-described features, it is preferred that the barrier layer have a film thickness of 200 nm or more.

According to this semiconductor light-emitting device, it is possible to obtain with high certainty an electrode with a structure in which the pad layer is not present in the side of the reflection layer.

Furthermore, in the semiconductor light-emitting device of the above-described features, it is preferred that the barrier layer have a film thickness of 300 nm or less.

According to this semiconductor light-emitting device, it is possible to suppress the formation of the barrier layer unnecessarily thick.

Furthermore, in the semiconductor light-emitting device of the above-described features, it is preferred that the barrier layer formed on the side surface of the reflection layer have a film thickness of 20 nm or more.

According to this semiconductor light-emitting device, the barrier layer having enough thickness is formed on the side surface of the reflection layer. Therefore, it is possible to suitably suppress the deterioration of the electrode.

Furthermore, in the semiconductor light-emitting device of the above-described features, it is preferred that the electrode further have an adhesion layer that contacts with the top surface of the semiconductor layered structure, and the reflection layer be formed on the top surface of the adhesion layer.

According to this semiconductor light-emitting device, it is possible to suitably bring the electrode into contact (e.g., ohmic contact) with the semiconductor layered structure by providing adhesion layer.

Furthermore, in the semiconductor light-emitting device of the above-described features, it is preferred that the adhesion layer be made of Ni, and have a film thickness of 4 nm or less.

According to this semiconductor light-emitting device, it is possible to suitably suppress the reduction in the reflectance of light by providing an adhesion layer of film thickness of 4 nm or less.

Furthermore, in the semiconductor light-emitting device of the above-described features, it is preferred that the adhesion layer be made of Ni, and have a film thickness of 2 nm or more.

According to this semiconductor light-emitting device, it is possible to prevent peeling of a part or all of the electrode since the peel strength of the electrode can be increased. Therefore, it is possible to increase the yield of the semiconductor light-emitting device and also suppress occurrence of failure during use of the semiconductor light-emitting device.

In addition, the present invention provides a method for forming an electrode comprising:

a photolithography step of forming an overhang-shaped resist on a semiconductor layered structure having a light-emitting layer that emits light by supplying electric power;

a reflection layer forming step of forming a reflection layer on a surface on which the resist is formed;

a barrier layer forming step of forming a barrier layer posterior to the reflection layer forming step;

a pad layer forming step of forming a pad layer posterior to the barrier layer forming step; and a lift-off step of removing the resist posterior to the pad layer forming step, wherein a side surface coverage, that is a value obtained by dividing a side deposition rate by a deposition rate vertical to a substrate is 15% or more at the start point of the barrier layer forming step and is 0% at the end point of the barrier layer forming step and in the pad layer forming step.

According to this method for forming an electrode, it is possible to easily form an electrode with a structure in which a pad layer is not present in the side of the reflection layer, using one resist.

Furthermore, in the method for forming an electrode of the above-described features, it is preferred that the reflection layer, the barrier layer and the pad layer are formed in the reflection layer forming step, the barrier layer forming step and the pad layer forming step, respectively, by continuous layer formation.

According to the method for forming an electrode, it is possible to rapidly and easily form each layer.

Furthermore, in the method for forming an electrode of the above-described features, it is preferred that the barrier layer at the end point of the barrier layer forming step have a film thickness of 200 nm or more.

According to this method for forming an electrode, it is possible to obtain with high certainty an electrode with a structure in which the pad layer is not present in the side of the reflection layer.

Furthermore, it is preferred that the method for forming an electrode of the above-described features further include an adhesion layer forming step of forming an adhesion layer that contacts with the top surface of the semiconductor layered structure, between the resist forming step and the reflection layer forming step, and the film deposition rate of the adhesion layer be more than 0 nm/sec and 0.05 nm/sec or less.

According to this method for forming an electrode, fluctuation in the film thickness can be reduced, thus it is possible to reproducibly obtain the semiconductor light-emitting device as designed. Furthermore, since the film thickness of the adhesion layer can be equalized, it is possible to increase adhesion strength of the adhesion layer. Therefore, it is possible to prevent peeling of the electrode, and also reduce contact resistance.

According to the semiconductor light-emitting device and the method for forming an electrode of the above-described features, it is possible to suppress the deterioration of the electrode and also form the electrode by a simple method.

DETAILED DESCRIPTION OF THE INVENTION

Hereinbelow, as the embodiment of the present invention, a case where the present invention is applied to LED is exemplified. However, the semiconductor light-emitting device to which the present invention can be applied is not limited to LED. It is possible to apply the present invention to the semiconductor light-emitting device in general, that emits light by supplying electric power via an electrode, for example, laser diode and the like.

<Semiconductor Light-Emitting Device>

Figure 1A:
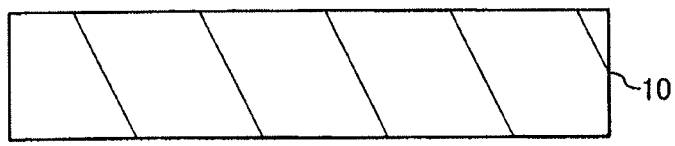
FIGS. 1A to 1E are cross sectional diagrams illustrating an example of a method for manufacturing the semiconductor light-emitting device according to an embodiment of the present invention.
Figure 1B:
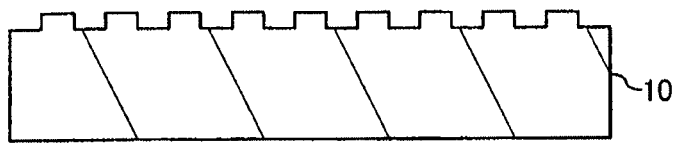
Figure 1C:
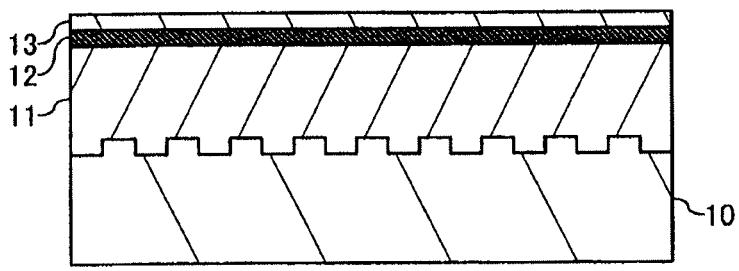
Figure 1D:
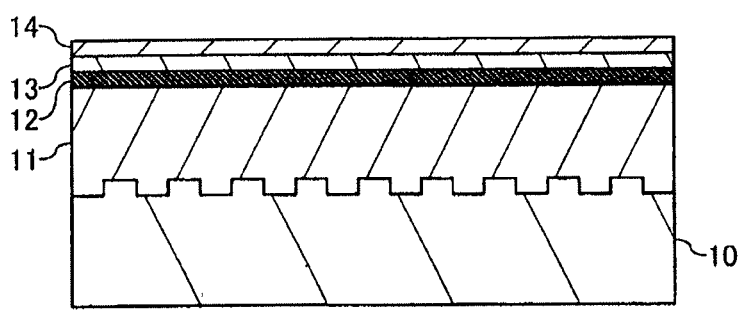
Figure 1E:
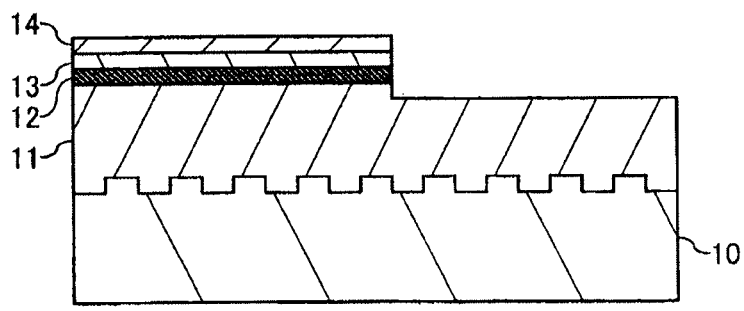
Figure 2A:
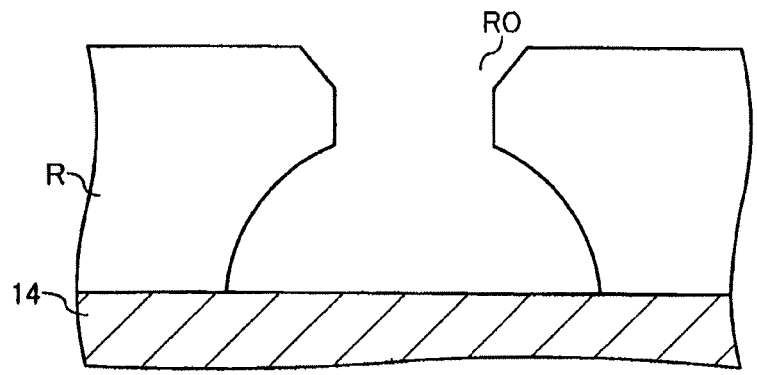
FIGS. 2A to 2C are cross sectional diagrams illustrating an example of a method for manufacturing the semiconductor light-emitting device according to an embodiment of the present invention.
Figure 2B:
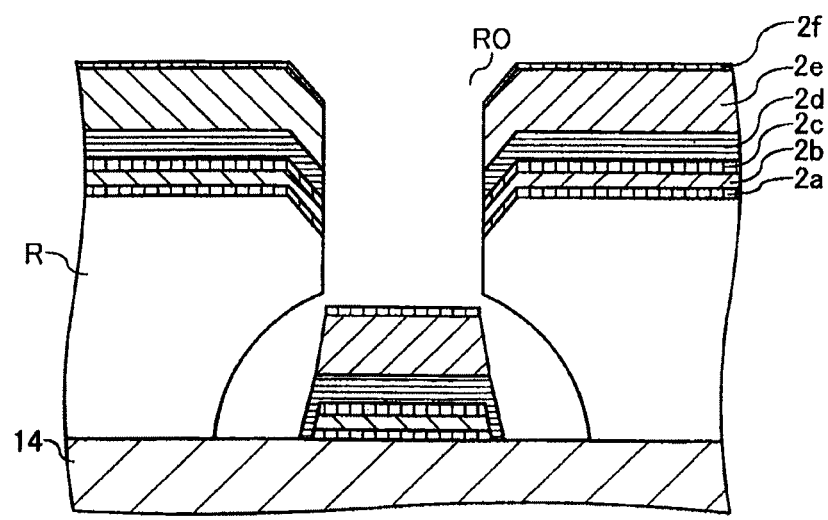
Figure 2C:
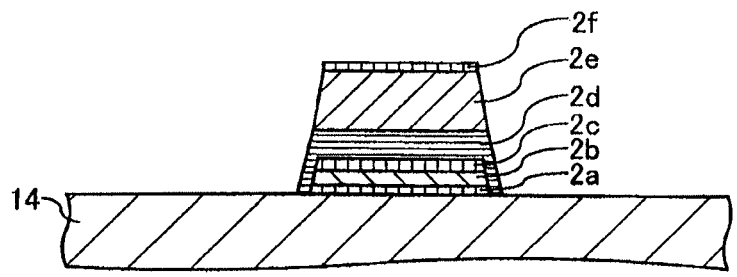
Figure 3:
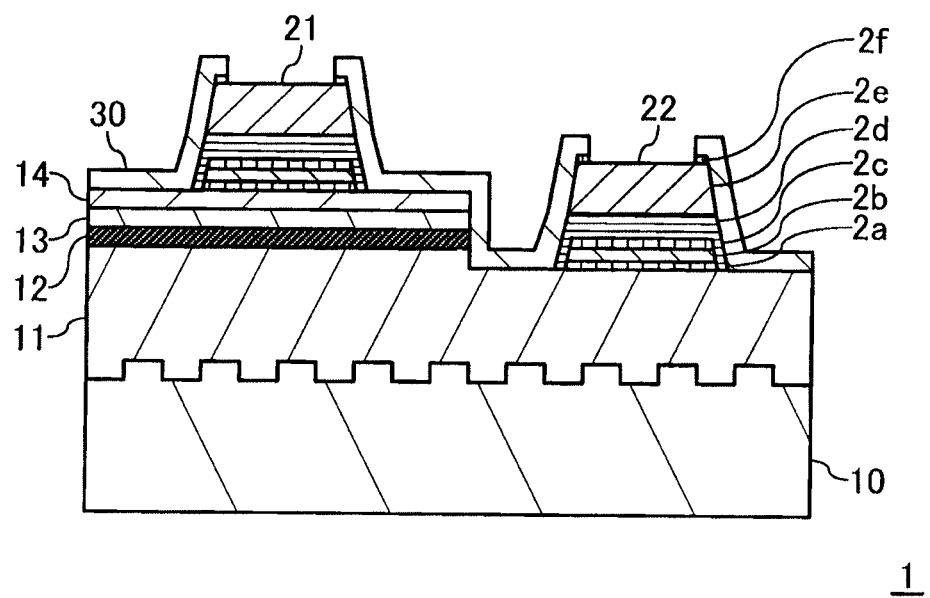
FIG. 3 is a cross sectional diagram illustrating an example of a method for manufacturing the semiconductor light-emitting device according to an embodiment of the present invention.

First, the semiconductor light-emitting device according to an embodiment of the present invention and an example of the manufacturing method thereof are described in reference to FIGS. 1A to 1E, FIGS. 2A to 2C, and FIG. 3. FIGS. 1A to 1E, FIGS. 2A to 2C, and FIG. 3 are cross sectional diagrams illustrating an example of a method for manufacturing the semiconductor light-emitting device according to an embodiment of the present invention. FIGS. 1A to 1E exemplify a method for laminating various semiconductor layers (method for forming a semiconductor layered structure). In addition, FIGS. 2A to 2C show the steps after FIGS. 1A to 1E, and exemplify a method for forming the electrode. In addition, FIG. 3 shows the step after FIGS. 2A to 2C, and exemplifies a method for forming a passivation layer.

First, as shown in FIG. 1A, a substrate 10 made of sapphire or the like is prepared. Then, as shown in FIG. 1B, a main surface that is one side of the substrate 10 (hereinafter, referred to as surface), is formed into a concavo-convex shape. For example, the concavo-convex shape can be formed by forming a resist on the surface of the substrate 10 except for the parts where concave portions (groove) should be formed and carrying out etching such as ICP (Inductively Coupled Plasma) using halogen gas (e.g., a mixed gas of $BCl_3$, $Cl_2$ and Ar).

Next, as shown in FIG. 1C, on the surface of the concavo-convex shaped substrate 10, an n-clad layer 11 made of n-type GaN, a light-emitting layer (active layer) 12 having a multi-quantum well structure in which barrier layers made of GaN and well layers made of $In_xGa_{1-x}N$ ($0<x\leq1$) are alternately laminated and also the first and last layers are barrier layers, and a p-clad layer 13 made of p-type GaN are laminated in this order.

The n-clad layer 11, the light-emitting layer 12 and the p-clad layer 13 can be laminated, for example, by MOCVD (Metal Organic Chemical Vapor Deposition) or the like. In addition, as a dopant of n-type GaN, for example, Si can be used. Also, as a dopant of p-type GaN, for example, Mg can be used. Moreover, after laminating this p-clad layer 13, annealing may be performed to activate p-type dopant. Also, other element such as Al may be contained in the GaN and $In_xGa_{1-x}N$ constituting the n-clad layer 11, the light-emitting layer 12 and the p-clad layer 13.

Next, as shown in FIG. 1D, a transparent electrode 14 made of ITO (Indium Tin Oxide) is formed on the p-clad layer 13. This transparent electrode 14 can be formed, for example, by sputtering.

In the method for manufacturing a semiconductor light-emitting device of this example, since an electrode is formed in the n-clad layer 11 in the later step, it is necessary to expose the n-clad layer 11 in the region in which the electrode is to be formed. Therefore, as shown in FIG. 1E, a part of the transparent electrode 14, the p-clad layer 13, the light-emitting layer 12 and the n-clad layer 11 in the region is removed.

For example, the transparent electrode 14 can be removed by etching with aqua regia or the like. For further example, the p-clad layer 13, the light-emitting layer 12 and the n-clad layer 11 can be removed by etching such as ICP using halogen gas (e.g., $SiCl_4$). However, when the etching is performed, it is necessary to form a resist except for the part to be removed. Here, each resist used in each etching is removed after the completion of each etching.

Next, a method for forming the electrode is described. Here, for simplification of description, only a method for forming a p-electrode is exemplified, but the same shall be applied to a method for forming an n-electrode. However, the p-electrode is provided in a part of the top surface of the transparent electrode 14, and the n-electrode is provided in a part of the top surface of the above-described n-clad layer 11 exposed by etching.

First, as shown in FIG. 2A, an overhang shaped-resist R is formed on the top surface of the transparent electrode 14. Here, while not shown in FIG. 2A, an overhang shaped-resist R is also formed on the top surface of the above-described n-clad layer 11 exposed by etching.

As the method for forming an overhang shaped-resist R, any well-known forming method may be used. For example, an overhang shaped-resist R may be formed by forming an ordinary resist of which wall surface of an opening is vertical and then selectively contracting or dissolving the top surface side of the transparent electrode 14 and the top surface side of the n-clad layer 11. In addition, for example, an overhang shaped-resist R may be formed by forming a resist without an opening and then selectively dissolving it so that the resist has an overhang shape. Here, as shown in FIG. 2A, it is preferable to make the periphery of an opening RO of the resist R concave since the material of the electrode can be efficiently introduced into the opening RO.

Next, as shown in FIG. 2B, on the top surface of the transparent electrode 14 on which the resist R is formed and the top surface of the n-clad layer 11, various layers constituting the electrode are sequentially formed by electron beam vapor deposition or the like. Specifically, a first Ni layer 2a (adhesion layer) made of Ni is formed, then an Al layer 2b (reflection layer) made of Al is formed, then a second Ni layer 2c made of Ni is formed, then a Pt layer 2d (barrier layer) made of Pt is formed, then an Au 2e (pad layer) made of Au is formed, and a third Ni layer 2f made of Ni is formed.

Each of the layers 2a to 2f is formed on the top surface of the resist R, and the material forming each of the layers 2a to 2f enters into the opening RO of the resist R, thereby forming layers also on each of the top surface of the transparent electrode 14 and the top surface of the n-clad layer 11. Specifically, on each of the top surface of the transparent electrode 14 and the top surface of the n-clad layer 11, each of the layers 2a to 2f is formed in the order of the first Ni layer 2a, the Al layer 2b, the second Ni layer 2c, the Pt layer 2d, the Au layer 2e, and the third Ni layer 2f, upward from the top surface of the transparent electrode 14 and the top surface of the n-clad layer 11. Here, it is preferred that each of the layers 2a to 2f be formed by continuous layer formation since it is possible to rapidly and easily form a layer.

In each of the top surface of the transparent electrode 14 and the top surface of the n-clad layer 11, the Pt layer 2d is formed on the top surface of the second Ni layer 2c, and also formed on the side surface of the Al layer 2b. On the other hand, the Au layer 2e is formed only on the top surface of the Pt layer 2d. Here, a part of the Pt layer 2d may be formed not only on the side surface of the Al layer 2b, but also on the side surfaces of the first Ni layer 2a and the second Ni layer 2c.

The detail of the conditions for forming the above-described layer is set forth below, and it is preferred that each of the layers 2a to 2f be made so as to have film thicknesses of 4 nm for the first Ni layer 2a, 50 nm for the Al layer 2b, 40 nm for the second Ni layer 2c, 250 nm for the Pt layer 2d, 700 nm for the Au layer 2e, and 20 nm for the third Ni layer 2f.

The first Ni layer 2a forms ohmic contacts with each of the transparent electrode 14 and the n-clad layer 11. In addition, the Al layer 2b reflects at least a part of light exiting from the light-emitting layer 12. Also, the second Ni layer 2c rigidly binds the Al layer 2b and the Pt layer 2d. Moreover, the Pt layer 2d secures the clearance between the Al layer 2b and the Au layer 2e and prevents the interdiffusion of Al and Au. Also, the Au layer 2e and the third Ni layer 2f electrically and mechanically connect to a wire for electrically connecting to an external power supply that supplies electric power, or the like.

Moreover, as shown in FIG. 2C, the resist R on which each of the layers 2a to 2f are formed is removed (lift-off) by wet etching or the like. Here, while it has been described illustrating an example of the method for forming a layer of each of the layers 2a to 2f simultaneously on each of the top surface of the transparent electrode 14 and the top surface of the n-clad layer 11, it is possible to separately form layers. In addition, heat treatment may be carried out after removing the resist R, as necessary.

Next, as shown in FIG. 3, a passivation layer 30 made of $SiO_2$ is each formed on the top surface of the transparent electrode 14, the top surface of the n-clad layer 11, and a part of the side surface and top surface of each of the layers 2a to 2f. The passivation layer 30 is formed, for example, by thoroughly forming $SiO_2$ by plasma CVD or the like, thereafter, forming a resist except for a part of the top face of each of the layers 2a to 2f (part to which wire or the like is bonded), and removing $SiO_2$ in the part using an etchant such as hydrofluoric acid. Furthermore, at this time, etching is performed until the Au layer 2e is exposed. As a result, an n-electrode 21 is formed on the top surface of the transparent electrode 14, and a p-electrode 22 is formed on the top surface of the n-clad layer 11. Here, the resist used in etching is removed after completion of the etching.

According to the above-described steps, a semiconductor light-emitting device 1 is formed. However, the semiconductor light-emitting device 1 is in the state of wafer (state where the substrate 10 and the n-clad layer 11 are the same, and a plurality of semiconductor light-emitting devices 1 is integrated) at this stage, and thus is divided into chips as necessary. This breaking is performed using the semiconductor light-emitting device 1 as a unit, and at least one semiconductor light-emitting device 1 is contained in one chip.

In this breaking step, first, a separation trench is formed on the n-clad layer 11. This separation trench can be formed, for example, by forming a resist except for the parts where a separation trench should be formed and performing etching such as ICP using halogen gas (e.g., $SiCl_4$) or the like. Here, the resist used in etching is removed after completion of the etching.

Next, the face of the substrate 10 on which concavity and convexity is not formed (hereinafter, referred to as back surface) is made thin by abrasion or the like. Moreover, a scribe groove is formed on the back surface of the substrate 10 by laser scribe or the like. At this time, the scribe groove in the substrate 10 is formed in the position opposite to the separation trench in the n-clad layer 11. Then, for example, a blade is pressed against the scribe groove formed on the back surface of the substrate 10, whereby the scribe groove and the separation trench are split up, so that the wafer is divided.

The chipped semiconductor light-emitting device 1 (hereinafter, referred to as chips), that is produced by the division described above, is mounted, for example, by wire bonding mounting. At this time, the light exiting from the light-emitting layer 12 is taken out from the top surface and side surface of the chips to the exterior.

Some of the light exiting from the light-emitting layer 12 is directly emitted to the outside, and some enter the p-electrode 21 and the n-electrode 22. However, the light entering the p-electrode 21 and the n-electrode 22 is reflected in the Al layer 2b in the p-electrode 21 and the n-electrode 22, and further reflected in the surface of the concavo-convex substrate 10, whereby the light can be taken out from the top surface and side surface of the chips to the exterior. Therefore, it is possible to efficiently exit light from the chips.

As described above, according to the semiconductor light-emitting device 1 and the method for forming an electrode of the present embodiment, the structure is formed such that the side surface of the Al layer 2b is covered with the Pt layer 2d, and also the Au layer 2e is not formed on the side of the Al layer 2b. Therefore, it is possible to suppress the corrosion of the Al layer 2b and also suppress the formation of an AuAl intermetallic by the interdiffusion of the Al forming the Al layer 2b and the Au forming the Au layer 2e. In addition, it is possible to easily form the electrodes 21 and 22 with a structure in which the Au layer 2e is not present in the side of the Al layer 2b using one resist R. Therefore, it is possible to suppress the deterioration of the electrodes 21 and 22 and form the electrodes 21 and 22 by a simple method.

<Preferred Conditions of Each Layer Forming Electrode>

Next, preferred conditions of each of the layers 2a to 2f forming the electrodes 21 and 22 are described with reference to the drawings.

Figure 4:
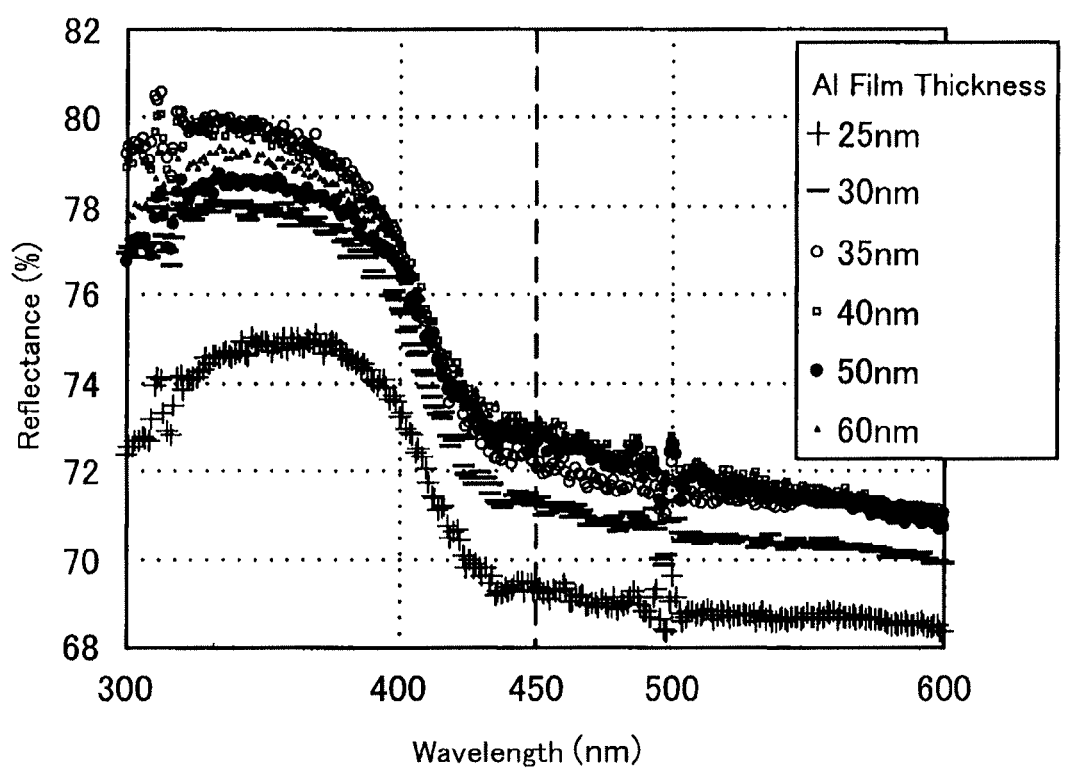
FIG. 4 is a graph showing the relationship between the wavelength of light and the reflectance at various Al thicknesses.
Figure 5:
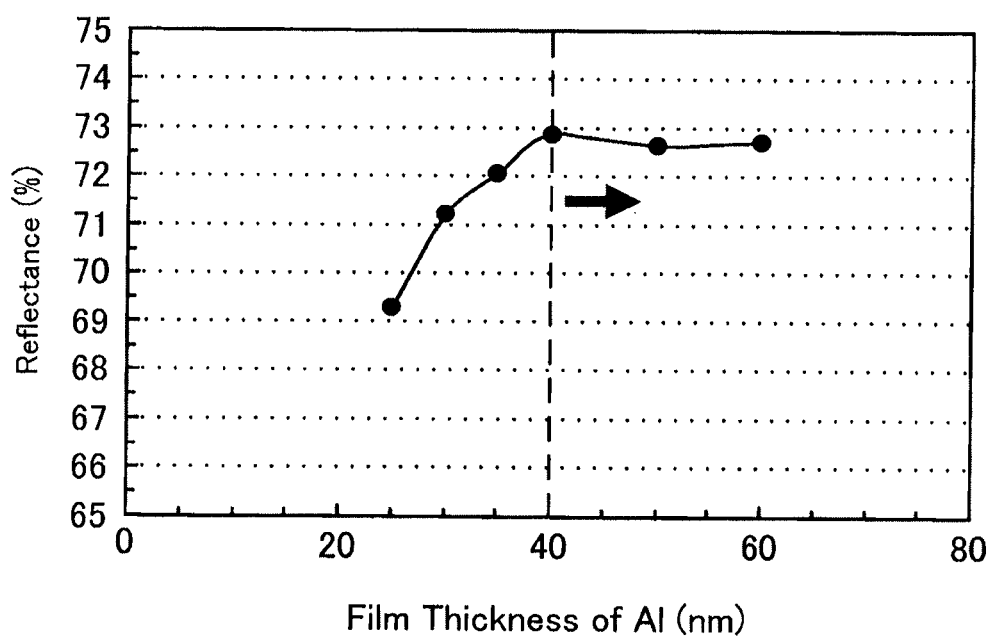
FIG. 5 is a graph showing the relationship between the film thickness of the Al layer and the reflectance when the wavelength of light is 450 nm.

First, film thickness conditions of the Al layer 2b for securing enough reflectance are described with reference to FIG. 4 and FIG. 5. FIG. 4 is a graph showing the relationship between the wavelength of light and the reflectance at various Al film thickness. FIG. 5 is a graph showing the relationship between the film thickness of the Al layer and the reflectance when the wavelength of light is 450 nm. Here, in the graph of FIG. 4, the axis of ordinate is the reflectance (%), and the axis of abscissa is the wavelength of light (nm). In addition, in the graph of FIG. 5, the axis of ordinate is the reflectance (%), and the axis of abscissa is the film thickness of the Al layer 2b (nm).

As shown in FIG. 4, in the approximate wavelength range of the light possibly exiting from the above-described semiconductor light-emitting device 1, when the film thickness of the Al layer 2b is reduced, the reflectance is lowered. Specifically, as shown in FIG. 5, when the Al layer 2b has a film thickness of less than 40 nm, the reflectance is rapidly lowered. On the other hand, when the Al layer 2b has a film thickness of 40 nm or more, the reflectance is stably increased. Therefore, it is preferred that the Al layer 2b have a film thickness of 40 nm or more including production tolerance.

Figure 6:
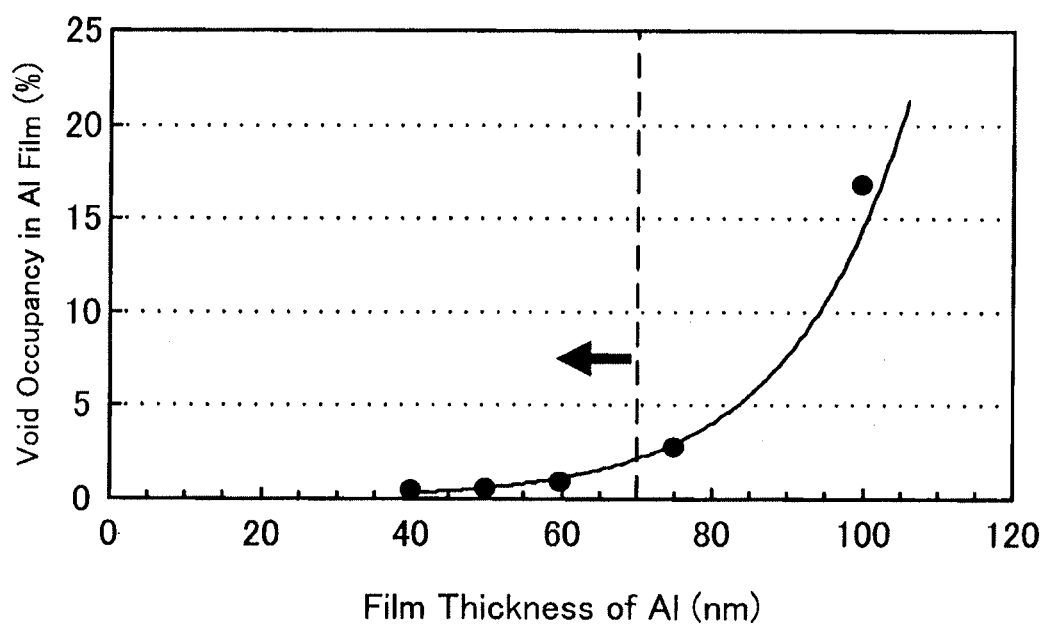
FIG. 6 is a graph showing the relationship between the film thickness of the Al layer and the void occupancy in the Al layer.
Figure 7:
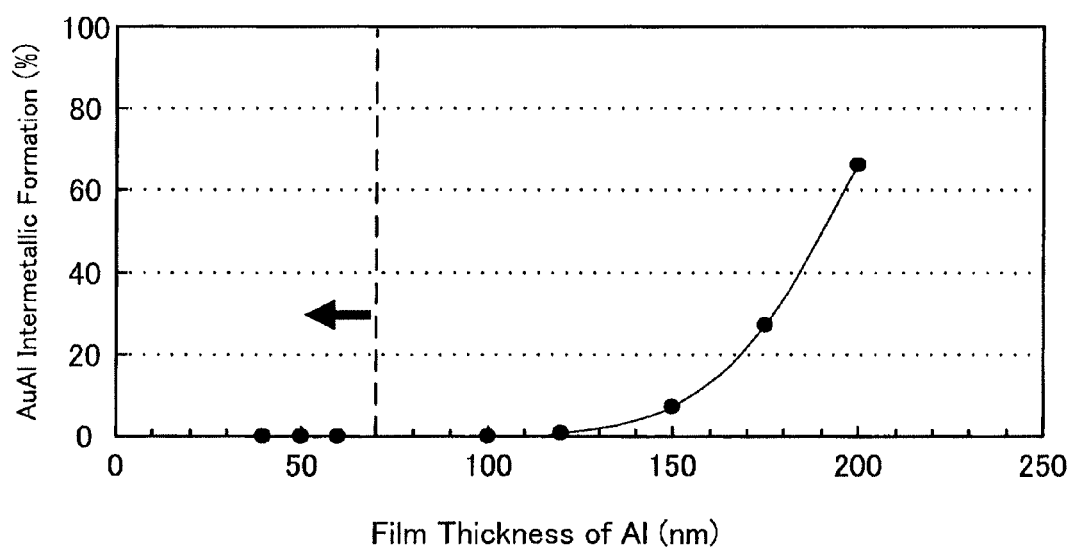
FIG. 7 is a graph showing the relationship between the film thickness of the Al layer and the rate of an AuAl intermetallic formation.

Next, film thickness conditions of the Al layer 2b for suppressing the deterioration of the electrodes 21 and 22 are described with reference to FIG. 6 and FIG. 7. FIG. 6 is a graph showing the relationship between the film thickness of the Al layer and the void occupancy in the Al layer. FIG. 7 is a graph showing the relationship between the film thickness of the Al layer and the rate of an AuAl intermetallic formation. Here, in the graph of FIG. 6, the axis of ordinate is the void occupancy per unit length of the Al layer 2b (%), and the axis of abscissa is the film thickness of the Al layer 2b (nm). In addition, in the graph of FIG. 7, the axis of ordinate is the rate of an AuAl intermetallic formation per unit length of the Al layer 2b (%), and the axis of abscissa is the film thickness of the Al layer 2b (nm).

The inventors of the present application have carried out a cross-sectional SEM (Scanning Electron Microscope) observation for each sample obtained by heating the electrodes 21 and 22 for various periods of time at various temperatures (250 to 450° C.) higher than the guarantee temperature of LED (140 to 150° C.), and obtained the void occupancy that is the length of the void per unit length of the Al layer 2b. Then, from this observation result, a knowledge that the larger the film thickness of the Al layer 2b and the higher the heating temperature, the larger the void occupancy, has been obtained.

Specifically, the inventors of the present application obtained the relationship between the film thickness of the Al layer 2b and the activation energy of the void growth, from the Arrhenius plot of this observation result. As a result, the activation energy at a film thickness of 50 nm was 0.41 eV, the activation energy at a film thickness of 75 nm was 0.32 eV, and the activation energy at a film thickness of 100 nm was 0.25 eV. Specifically, it was found that the smaller the film thickness of the Al layer 2b, the larger the activation energy of the void growth, and a void is less likely to be formed.

The void occupancy modeled based on the above result is represented by a following formula (1). In the following formula (1), S is a void occupancy, $S_0$ is an initial void occupancy, $C_s$ is a constant, $Ea_s$ is an activation energy of the void growth, k is a Boltzmann constant, T is an absolute temperature, and t is a heating time.

$$S = S_0 + C_s \cdot \text{EXP}(-Ea_s/kT) \cdot ln(t) \quad (1)$$

FIG. 6 is a graph obtained by applying the formula (1) to the conditions of practical use of LED. Specifically, in the formula (1), absolute temperature T is set to 418 K (145° C.), and heating time t is set to one hundred thousand hours, and the void occupancies S at various film thicknesses of the Al layer 2b are obtained, and are graphically shown.

As shown in FIG. 6, when the film thickness of the Al layer 2b is increased too much, the void occupancy in the Al layer 2b is increased. Specifically, when the Al layer 2b has a film thickness of more than 70 nm, the void occupancy in the Al layer 2b is rapidly increased. On the other hand, when the Al layer 2b has a film thickness of 70 nm or less, the void occupancy is stably reduced. Therefore, from the viewpoint of suitably suppressing the generation of a void, it is preferred that the Al layer 2b have a film thickness of 70 nm or less.

Similarly, the inventors of the present application have carried out a cross-sectional SEM observation for each sample obtained by heating the electrodes 21 and 22 for various periods of time at various temperatures (250 to 450° C.) higher than the guarantee temperature of LED (140 to 150° C.), and obtained the rate of an AuAl intermetallic that is the length of the AuAl intermetallic per unit length of the Al layer 2b. Then, from this observation result, a knowledge that the larger the film thickness of the Al layer 2b and the higher the heating temperature, the larger the rate of an AuAl intermetallic has been obtained.

Specifically, the inventors of the present application obtained the relationship between the film thickness of the Al layer 2b and the activation energy of the AuAl intermetallic growth, from the Arrhenius plot of this observation result. As a result, the activation energy at a film thickness of 50 nm was 1.45 eV, the activation energy at a film thickness of 100 nm was 1.22 eV, and the activation energy at a film thickness of 200 nm was 0.97 eV. Specifically, it has been found that the smaller the film thickness of the Al layer 2b, the larger the activation energy of the AuAl intermetallic growth, and the AuAl intermetallic is less likely to be formed (the interdiffusion of Au and Al is suppressed).

The rate of an AuAl intermetallic modeled based on the above result is represented by a following formula (2). In the following formula (2), X is a rate of an AuAl intermetallic, $C_x$ is a constant, $Ea_x$ is an activation energy of the AuAl layer growth, k is a Boltzmann constant, T is an absolute temperature, and t is a heating time.

$$X = C_x \cdot \text{EXP}(-Ea_x/kT) \cdot ln(t) \quad (2)$$

FIG. 7 is a graph obtained by applying the formula (2) to the conditions of practical use of LED. Specifically, in the formula (2), absolute temperature T is set to 418 K (145° C.), and heating time t is set to one hundred thousand hours, and the rates of an AuAl intermetallic X at various film thicknesses of the Al layer 2b are obtained, and are graphically shown.

As shown in FIG. 7, when the film thickness of the Al layer 2b is increased too much, the rate of an AuAl intermetallic is increased. Specifically, when the Al layer 2b has a film thickness of more than 150 nm, the rate of an AuAl intermetallic is rapidly increased. On the other hand, when the Al layer 2b has a film thickness of 150 nm or less, the rate of an AuAl intermetallic is stably reduced. Therefore, from the viewpoint of suitably suppressing the formation of an AuAl intermetallic (interdiffusion of Au and Al), it is preferred that the Al layer 2b have a film thickness of 150 nm or less.

As described above, the Al layer 2b has a film thickness of 40 nm or more and 70 nm or less, whereby it is possible to suppress the generation of a void in the Al layer 2b and suppress the formation of an AuAl intermetalic resulting from the interdiffusion of Al and Au.

Figure 8:
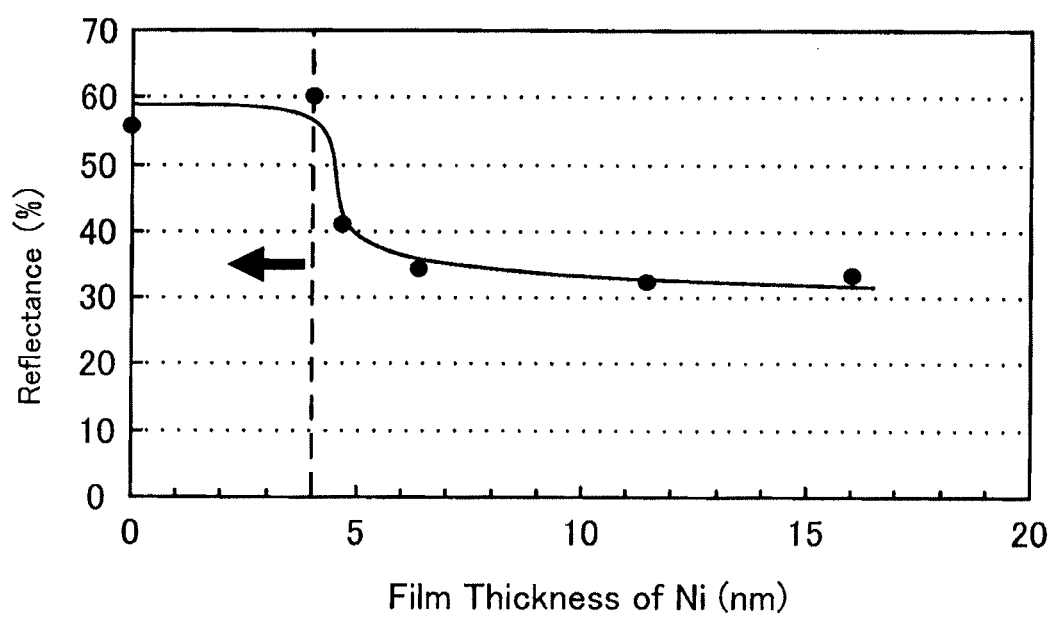
FIG. 8 is a graph showing the relationship between the film thickness of the first Ni layer and the reflectance when the wavelength of light is 450 nm.

Next, film thickness conditions of the first Ni layer 2a are described with reference to FIG. 8. FIG. 8 is a graph showing the relationship between the film thickness of the first Ni layer and the reflectance when the wavelength of light is 450 nm. Here, in the graph of FIG. 8, the axis of ordinate is the reflectance (%), and the axis of abscissa is the film thickness of the first Ni layer 2a (nm).

As shown in FIG. 8, when the film thickness of the first Ni layer 2a is increased, the reflectance is lowered. Specifically, when the first Ni layer 2a has a film thickness of more than 4 nm, the reflectance is rapidly lowered. On the other hand, when the first Ni layer 2a has a film thickness of 4 nm or less, the reflectance is stably increased. Therefore, it is preferred that the first Ni layer 2a have a film thickness of 4 nm or less.

As described above, the first Ni layer 2a has a film thickness of 4 nm or less, whereby it is possible to suitably suppress the lowering of the reflectance of light by providing the first Ni layer 2a.

Figure 9:
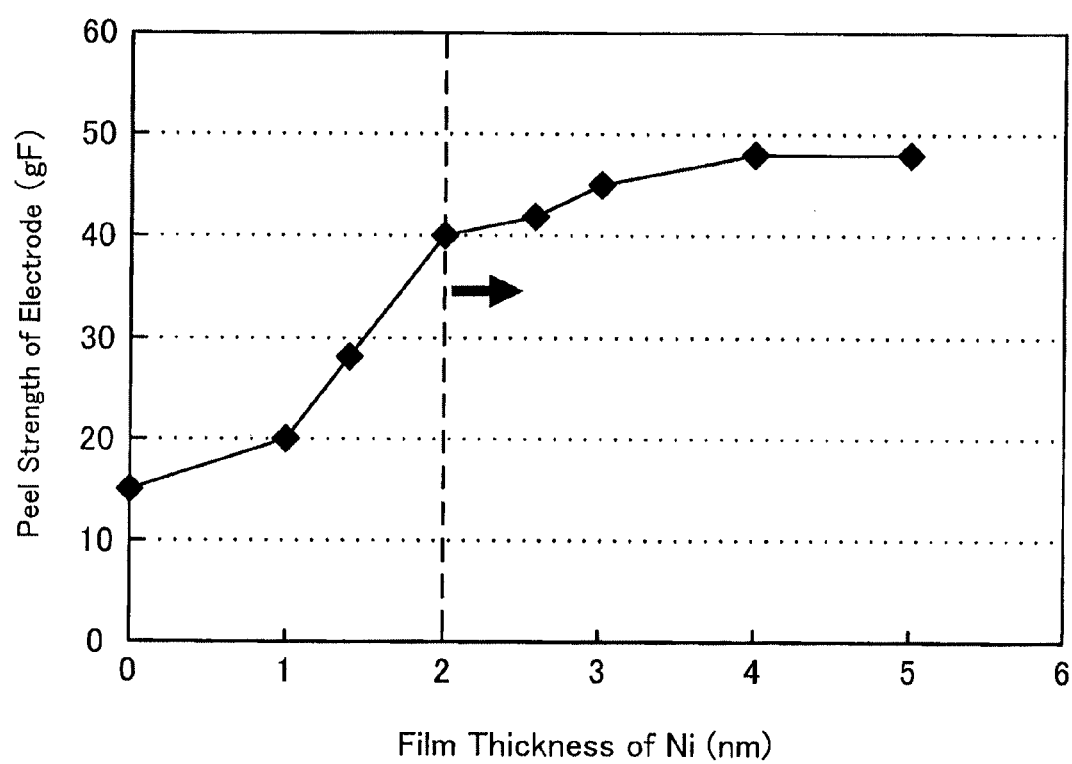
FIG. 9 is a graph showing the relationship between the film thickness of the first Ni layer and the peel strength of the electrode.

Furthermore, film thickness conditions of the first Ni layer 2a are described with reference to FIG. 9. FIG. 9 is a graph showing the relationship between the film thickness of the first Ni layer and the peel strength of the electrode. Here, in the graph of FIG. 9, the axis of ordinate is the peel strength of the electrodes 21 and 22 (gF: gram force), and the axis of abscissa is the film thickness of the first Ni layer 2a (nm). Here, the peel strength refers to the force required to peel an object (electrodes 21 and 22 in this case) from the bonded face. In addition, in FIG. 9, the unit of the peel strength of the electrodes 21 and 22 is gF (gram force), and 1 gF≈9.8×10$^{-3}$N.

As shown in FIG. 9, when the first Ni layer 2a has a film thickness of less than 2 nm, the peel strength of the electrodes 21 and 22 is rapidly reduced. On the other hand, when the first Ni layer 2a has a film thickness of 2 nm or more, the peel strength of the electrodes 21 and 22 is stably increased. Therefore, it is preferred that the first Ni layer 2a have a film thickness of 2 nm or more.

As described above, the first Ni layer 2a has a film thickness of 2 nm or more, whereby the peel strength of the electrodes 21 and 22 can be increased, then it is possible to prevent peeling of a part or all of the electrodes 21 and 22. Therefore, it is possible to increase the yield of the semiconductor light-emitting device 1 and also suppress the occurrence of failure during use of the semiconductor light-emitting device 1.

Figure 10:
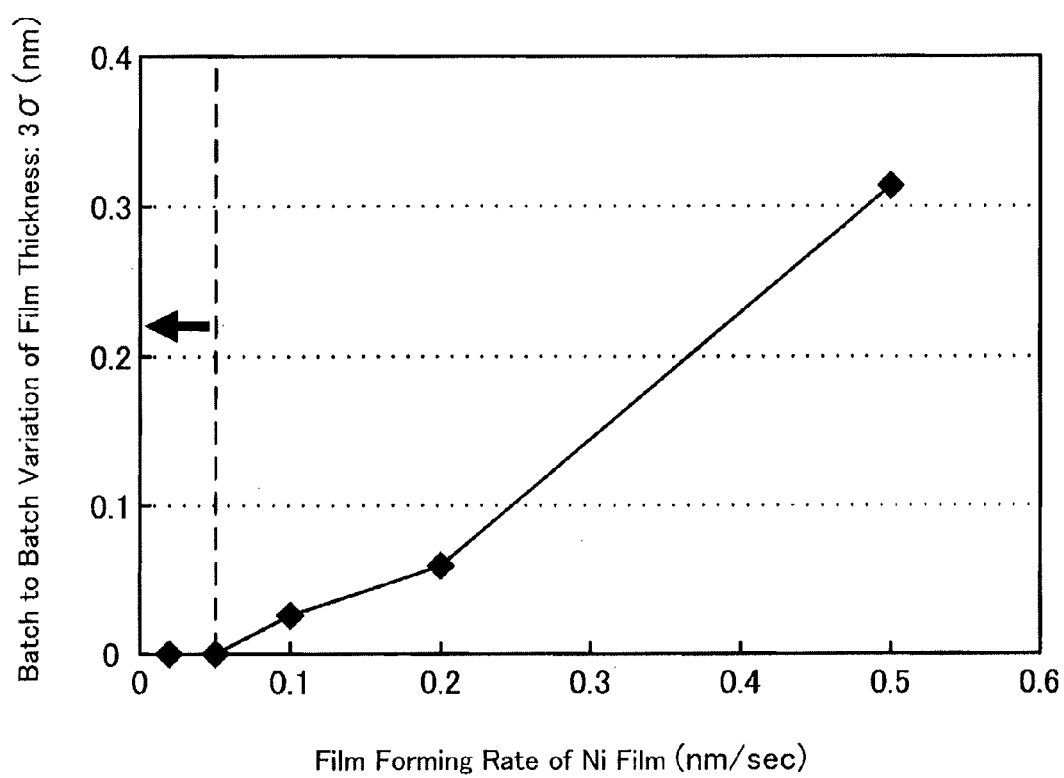
FIG. 10 is a graph showing the relationship between the deposition rate of the first Ni layer and the batch to batch variation of thickness.

Next, film forming conditions of the first Ni layer 2a are described with reference to FIG. 10. FIG. 10 is a graph showing the relationship between the film deposition rate of the first Ni layer and the batch to batch film thickness variation. Here, in the graph of FIG. 10, the axis of ordinate expresses the batch to batch variation of film thickness of the first Ni layer 2a by 3 σ (nm), and the axis of abscissa is the film deposition rate of the first Ni layer 2a (nm/sec). Here, 3 σ refers to three times of the standard deviation, and almost all data (film thickness) belongs to the range of average value ±3 σ (when the variation is normally-distributed, 99.7% of data (film thickness) belongs to this range). Therefore, as 3 σ is smaller, whole variation of data (film thickness) is small, and the data (film thickness) is gathered around a predetermined value.

As shown in FIG. 10, when the film deposition rate of the first Ni layer 2a is more than 0.05 nm/sec, the batch to batch variation of film thickness 3 σ is rapidly increased. On the other hand, when the film deposition rate of the first Ni layer 2a is 0.05 nm/sec or less, the batch to batch variation of film thickness 3 σ is stably reduced (in example of FIG. 10, nearly zero). Therefore, it is preferred that the film forming rate of the first Ni layer 2a be 0.05 nm/sec or less. Here, the film deposition rate of the first Ni layer 2a is naturally more than 0 nm/sec.

As described above, the film deposition rate of the first Ni layer 2a is 0.05 nm/sec or less, whereby the variation in the film thickness can be reduced, thus it is possible to reproducibly obtain the semiconductor light-emitting device 1 as designed. Furthermore, since the film thickness of the first Ni layer 2a can be equalized, it is possible to increase adhesion of the first Ni layer 2a. Therefore, it is possible to prevent peeling of the electrodes 21 and 22, and also reduce the contact resistance.

Next, film thickness conditions of the Pt layer 2d are described with reference to FIGS. 11A and 11B and FIG. 12. Hereinbelow, for the sake of convenience of the description, the film thickness in the direction of the top surface is referred to as "film thickness" as heretofore, and the film thickness in the direction of the side surface (specifically, the film thickness in the direction of the side surface of the Al layer 2b) is referred to as "side surface film thickness", to distinguish.

Figure 11A:
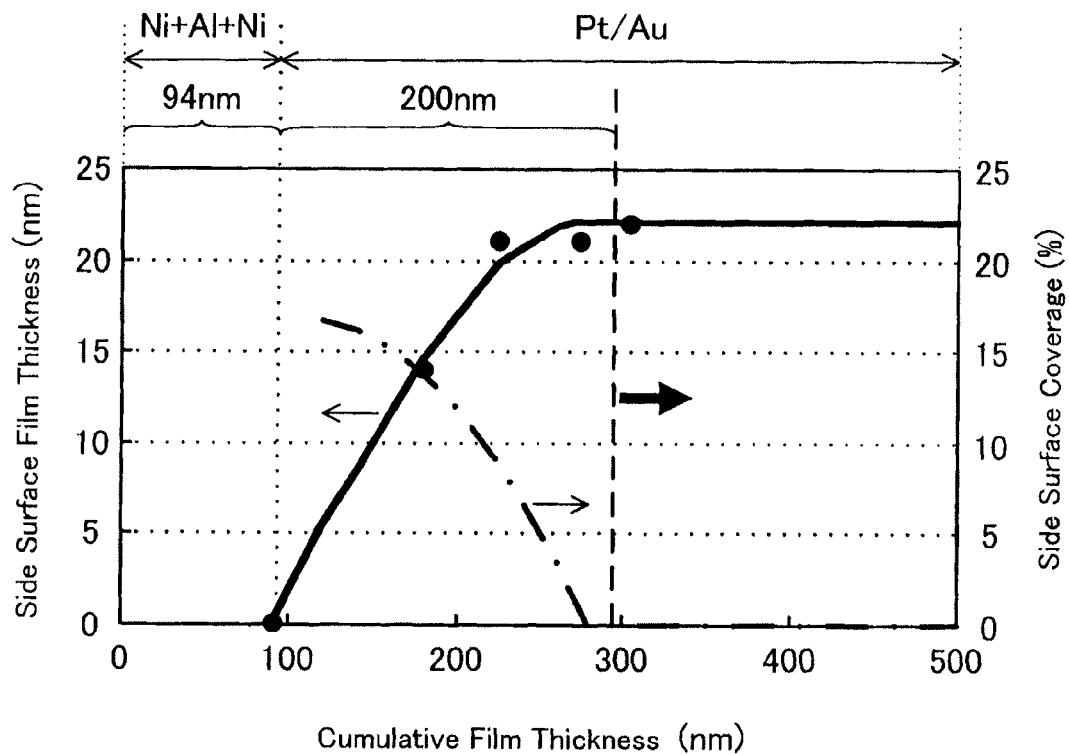
FIGS. 11A and 11B are a graph showing the relationship between the cumulative layer thickness and the side surface film thickness and a schematic diagram describing a side surface coverage.
Figure 11B:
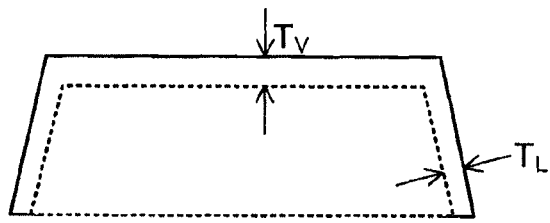

FIG. 11A is a graph showing the relationship between the cumulative value of the film thickness (cumulative film thickness) and the side surface film thickness when the first Ni layer 2a, the Al layer 2b, the second Ni layer 2c, the Pt layer 2d and the Au layer 2e are formed in order (continuous film formation), and FIG. 11B is a schematic diagram describing a side surface coverage. Here, in the solid line graph in FIG. 11A, the axis of ordinate is the side surface film thickness of the Pt layer 2d and the Au layer 2e (nm), and the axis of abscissa is the cumulative film thickness (nm). In addition, in the dashed-dotted line graph in FIG. 11A, the axis of ordinate is the side surface coverage (%) of the Pt layer 2d and the Au layer 2e, and the axis of abscissa is the cumulative film thickness (nm). Also, the graphs shown in FIG. 11A illustrate a case where the first Ni layer 2a has a film thickness of 4 nm, the Al layer 2b has a film thickness of 50 nm, and the second Ni layer 2c has a film thickness of 40 nm.

Figure 12:
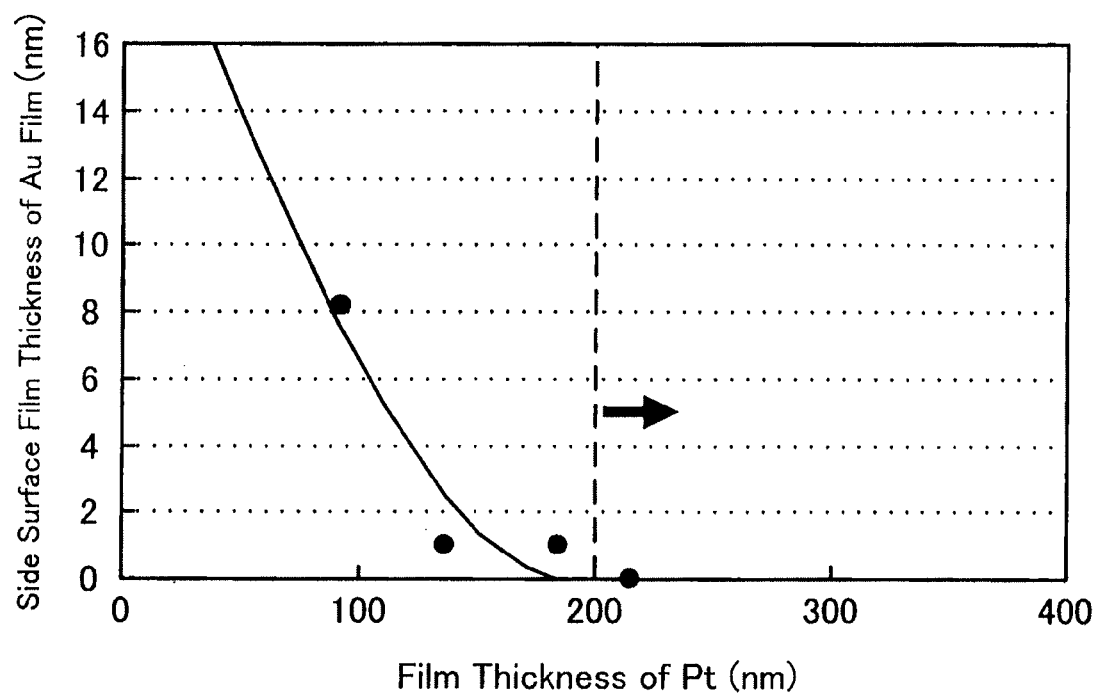
FIG. 12 is a graph showing the relationship between the film thickness of the Pt layer and the side surface film thickness of the Au layer.

In addition, FIG. 12 is a graph showing the relationship between the film thickness of the Pt layer and the side surface film thickness of the Au layer. Here, in the graph of FIG. 12, the axis of ordinate is the side surface film thickness of the Au layer 2e, and the axis of abscissa is the film thickness of the Pt layer 2d.

As shown in the solid line graph in FIG. 11A, the side surface film thickness of the Pt layer 2d formed on the side surface of the Al layer 2b is increased until having a film thickness of 200 nm, and in a film thickness of 200 nm or more, the side surface film thickness is constant at the value of 20 nm or more. Specifically, when the Pt layer 2d has a film thickness of 200 nm or more, the Pt layer 2d and the Au layer 2e are not formed on the side surface of the Al layer 2b after that, and the Pt layer 2d and the Au layer 2e are formed only to the upper direction.

The similar thing is described based on the side surface coverage. Here, as shown in FIG. 11B, the side surface coverage is the value obtained by dividing the film deposition rate of the side surface film thickness (increment) TL by the film deposition rate of the film thickness (increment) Tv (TL/Tv).

As shown in the dashed-dotted line graph in FIG. 11A, as the formation of the Pt layer 2d and the Au layer 2e are progressed to increase the total film thickness, the side surface coverage that is 15% or more at the start of film deposition is gradually reduced. Specifically, as the film thickness of the Pt layer 2d is increased, the Pt layer 2d and the Au layer 2e are less likely to be formed on the side surface of the Al layer 2b. Moreover, when the Pt layer 2d has a film thickness of 200 nm or more, the side surface coverage is 0%. Specifically, when the Pt layer 2d has a film thickness of 200 nm or more, the Pt layer 2d and the Au layer 2e are not formed on the side surface of the Al layer 2b.

As shown in FIG. 12, when the Pt layer 2d is made so as to have a film thickness of less than 200 nm, the side surface film thickness of the Au layer 2e is more than 0 nm (the Au layer 2e is formed in the direction of the side surface of the Al layer 2b). On the other hand, when the Pt layer 2d is made so as to have a film thickness of 200 nm or more, the side surface film thickness of the Au layer 2e is 0 nm (the Au layer 2e is not formed in the direction of the side surface of the Al layer 2b). Therefore, the Pt layer 2d is made so as to have a film thickness of 200 nm or more using this property, whereby it is possible to prevent the deposition of the Au layer 2e in the side of the Al layer 2b in the film deposition stage of the Au layer 2e.

On the other hand, it is preferred that the Pt layer 2d be made to have a film thickness of 200 nm or more that is the above-described lower limit, considering product variation and the like. However, it is not preferred that the film thickness of the Pt layer 2d be excessively increased since the amount of necessary source materials is increased, or the time required for manufacturing process gets longer. Therefore, it is preferred that the Pt layer 2d have a film thickness of, for example, 300 nm or less. Specifically, for example, assuming the product variation is ±50 nm or so, it is preferred that the Pt layer 2d be set to have a film thickness of 250 nm.

As described above, it is preferred that the Pt layer 2d have a film thickness of 200 nm or more and 300 nm or less. At this time, it is possible to obtain with high certainty the electrodes 21 and 22 with a structure in which the Au layer 2e is not present in the side of the Al layer 2b. In addition, it is possible to form the Pt layer 2d having enough side surface film thickness (20 nm or more) capable of suitably suppressing the deterioration of the electrodes 21 and 22. Furthermore, it is possible to suppress the formation of the Pt layer 2d unnecessarily thick.

Figure 13:
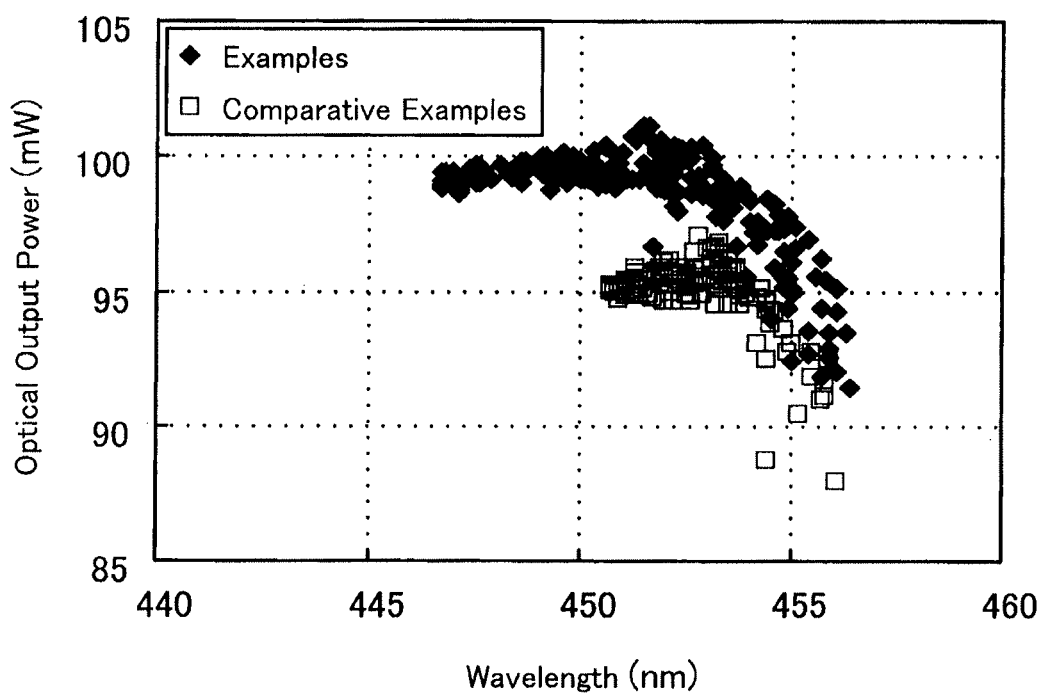
FIG. 13 is a graph showing each of operation examples of practical examples and comparative examples.

Next, operation examples of the semiconductor light-emitting device 1 satisfying the above conditions (hereinafter, referred to as examples) and operation examples of the semiconductor light-emitting device not satisfying the above conditions and not having a reflection layer (hereinafter, referred to as comparative examples) are each described with reference to FIG. 13. FIG. 13 is a graph showing each of the operation examples of examples and comparative examples.

The graph of FIG. 13 shows the result measured by supplying a predetermined electric current (e.g., 85 mA) to a semiconductor light-emitting device and focusing exit light by an integrating sphere as an optical output power by wavelength. Here, in FIG. 13, the operation results of examples are denoted by ♦ in the figure, and the operation results of comparative examples are denoted by □ in the figure. Here, in the graph of FIG. 13, the axis of ordinate is the optical output power (mW), and the axis of abscissa is the wavelength (nm).

As shown in FIG. 13, in the whole of emission wavelength, the optical output of the light exiting from examples is larger than the optical output of the light exiting from comparative examples (in this case, 3.8 mW or so, and 4% or so in the ratio). Specifically, examples can exit light more efficiently than comparative examples.

In addition, high temperature high humidity bias test (temperature: 85° C., humidity: 85%, reverse bias: −5 V, drive time: 1000 hours) has been performed on examples, and it has been able to confirm that there is no problem for forward voltage properties, optical output power properties, and breakdown voltage properties and also confirm that there is no problem for corrosion.

Figure 14:
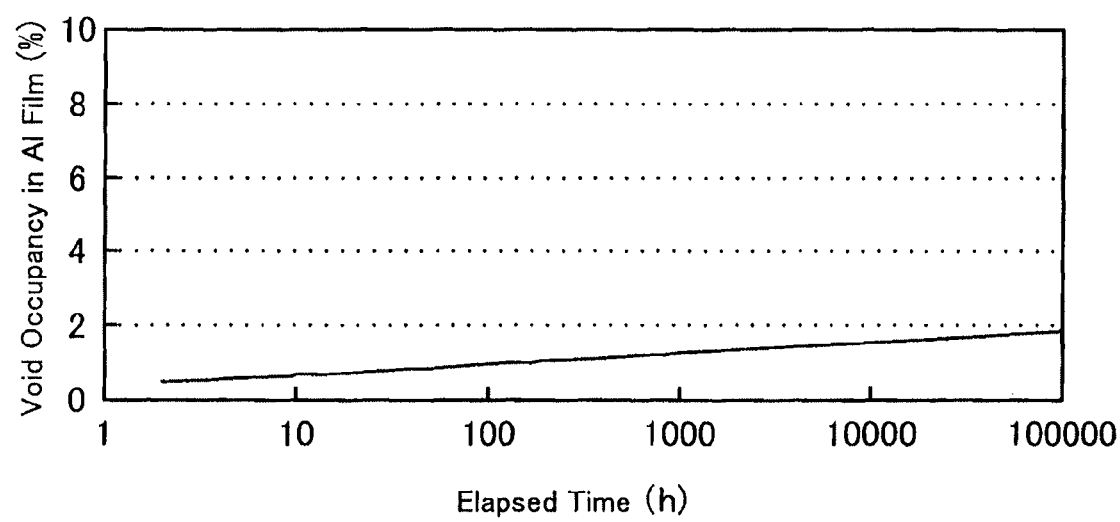
FIG. 14 is a graph showing the relationship between the elapsed time and the void occupancy in the Al layer, under the conditions of practical use of examples.
Figure 15:
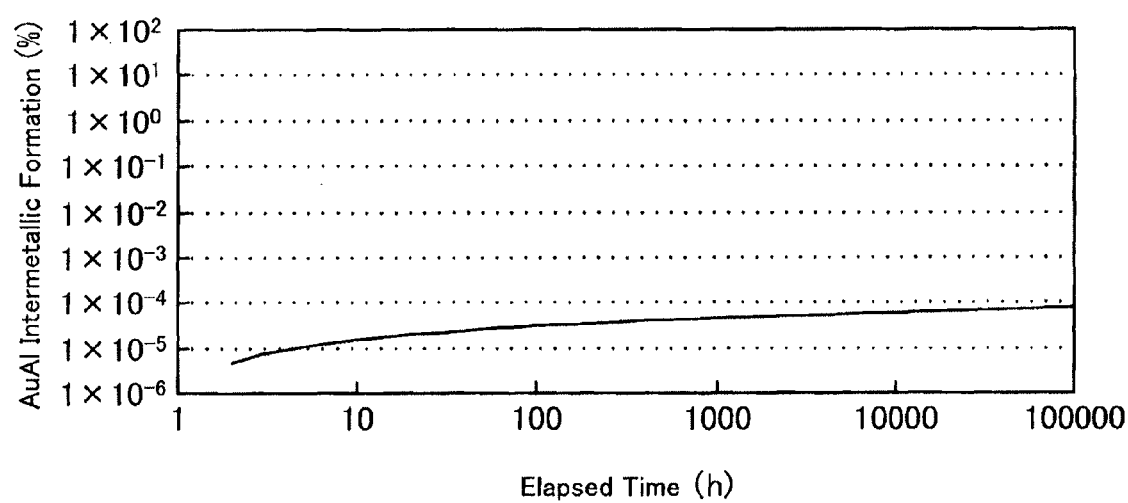
FIG. 15 is a graph showing the relationship between the elapsed time and the rate of formation of an AuAl intermetallic, under the conditions of practical use of examples.

Also, the incidence of void formation and the rate of an AuAl intermetallic of examples under the conditions of practical use (temperature: 145° C.) are described with reference to FIG. 14 and FIG. 15. FIG. 14 is a graph showing the relationship between the elapsed time and the void occupancy in the Al layer, under the conditions of practical use of examples. Also, FIG. 15 is a graph showing the relationship between the elapsed time and the rate of an AuAl intermetallic, under the conditions of practical use of examples. Here, the graph of FIG. 14 is obtained by the formula (1) when the Al layer 2b has a film thickness of 70 nm, and the graph of FIG. 15 is obtained by the formula (2) when the Al layer 2b has a film thickness of 70 nm. In addition, in the graph of FIG. 14, the axis of ordinate is the void occupancy per unit length of the Al layer 2b (%), and the axis of abscissa is the elapsed time under the conditions of practical use (h). Also, in the graph of FIG. 15, the axis of ordinate is the rate of an AuAl intermetallic per unit length of the Al layer 2b (%), and the axis of abscissa is the elapsed time under the conditions of practical use (h).

As shown in FIG. 14, the incidence of void formation after a lapse of one hundred thousand hours is 1.8%. On the other hand, as shown in FIG. 15, the rate of an AuAl intermetallic after a lapse of one hundred thousand hours is $8\times10^{-5}$%. Both values are in the acceptable level in terms of the reliability of a semiconductor light-emitting device.

<Variations>

The constitution of the semiconductor light-emitting device 1 described above is merely one example, and may be properly changed. For example, any well-known structure can be adopted to the semiconductor layered structure 11 to 14. However, it is preferred that the semiconductor light-emitting device have a structure having a light-emitting layer and an electrode for supplying electric power to the light-emitting layer.

In addition, the constitution of the p-electrode 21 and the n-electrode 22 described above is merely one example, and may be any constitution so long as it has a reflection layer that reflects at least a part of light exiting from the light-emitting layer 12, a pad layer, a barrier layer that suppresses reaction of the reflection layer and the pad layer.

Moreover, in the above example, while a case where each of the layers 2a to 2f constituting the p-electrode 21 and the n-electrode 22 is made of one type of metal is exemplified, at least one of these layers may contain plural types of metals. In addition, a part or all of each of the layers 2a to 2f constituting the p-electrode 21 and the n-electrode 22 may be different from the above examples.

For example, while a case where the barrier layer is made of Pt is exemplified, the barrier layer may be made of other materials. However, from the viewpoint of suitably suppressing the deterioration of the p-electrode 21 and the n-electrode 22, it is preferred that the barrier layer be made of a high melting point metal having a higher melting point than those of the material forming the reflection layer (Al) and the material forming the pad layer (Au) (for example, containing at least one of Pt, Mo, and W).

The semiconductor light-emitting device and the method for forming an electrode according to the present invention have suitably used for LED or the like, mounted on a lighting system or the like.

Although the present invention has been described in terms of the preferred embodiment, it will be appreciated that various modifications and alternations might be made by those skilled in the art without departing from the spirit and scope of the invention. The invention should therefore be measured in terms of the claims which follow.

What is claimed is:

1. A method for forming an electrode comprising:
a photolithography step of forming an overhang-shaped resist on a semiconductor layered structure having a light-emitting layer that emits light by supplying electric power;
a reflection layer forming step of forming a reflection layer on a surface on which the resist is formed;
a barrier layer forming step of forming a barrier layer posterior to the reflection layer forming step;
a pad layer forming step of forming a pad layer posterior to the barrier layer forming step; and
a lift-off step of removing the resist posterior to the pad layer forming step, wherein
a side surface coverage, that is a value obtained by dividing a side deposition rate by a deposition rate vertical to a substrate
is 15% or more at the start point of the barrier layer forming step and is 0% at an end point of the barrier layer forming step and in the pad layer forming step.

2. The method according to claim 1, wherein
the reflection layer, the barrier layer and the pad layer are formed in the reflection layer forming step, the barrier layer forming step and the pad layer forming step, respectively, by continuous layer deposition.

3. The method according to claim 1, wherein
the barrier layer at the end point of the barrier layer deposition step has a film thickness of 200 nm or more.

4. The method according to claim 1, further comprising
an adhesion layer forming step of forming an adhesion layer that contacts with a top surface of the semiconductor layered structure, between the photolithography step and the reflection layer forming step, wherein
a film deposition rate of the adhesion layer in the adhesion layer forming step is more than 0 nm/sec and 0.05 nm/sec or less.

* * * * *